United States Patent
Granier et al.

(10) Patent No.: US 7,743,351 B2
(45) Date of Patent: Jun. 22, 2010

(54) CHECKING THE ROBUSTNESS OF A MODEL OF A PHYSICAL SYSTEM

(75) Inventors: Hugues Granier, Samoreau (FR); Christian Bregaint, Nandy (FR); Philippe Tonnelier, Livry sur Seine (FR); Marc Croix Marie, Auvernaux (FR)

(73) Assignee: Hispano Suiza, Colombes (FR)

( * ) Notice: Subject to any disclaimer, the term of this patent is extended or adjusted under 35 U.S.C. 154(b) by 0 days.

(21) Appl. No.: 11/122,109

(22) Filed: May 5, 2005

(65) Prior Publication Data
US 2005/0262457 A1 Nov. 24, 2005

(30) Foreign Application Priority Data
May 5, 2004 (FR) .................................. 04 04805

(51) Int. Cl.
G06F 9/45 (2006.01)
G06F 17/50 (2006.01)

(52) U.S. Cl. ......................................................... 716/5
(58) Field of Classification Search ...................... 716/5
See application file for complete search history.

(56) References Cited

U.S. PATENT DOCUMENTS

| | | | |
|---|---|---|---|
| 6,577,981 B1 | 6/2003 | Grey et al. | |
| 2003/0083858 A1* | 5/2003 | Musliner et al. | 703/22 |
| 2003/0191565 A1* | 10/2003 | Ostrom et al. | 701/29 |
| 2004/0220786 A1* | 11/2004 | Tiwari et al. | 703/2 |
| 2005/0138585 A1* | 6/2005 | Cerny et al. | 716/5 |
| 2005/0188337 A1* | 8/2005 | Baumgartner et al. | 716/6 |
| 2005/0222721 A1* | 10/2005 | Chen et al. | 701/14 |
| 2007/0136701 A1* | 6/2007 | Baumgartner et al. | 716/5 |

FOREIGN PATENT DOCUMENTS

| | | |
|---|---|---|
| EP | 1117044 A1 | 7/2001 |
| GB | 2 362 728 A | 11/2001 |

OTHER PUBLICATIONS

Ostroff; "Formal Methods for the Specification and Design of Real-Time Safety Critical Systems"; Apr. 1992; Journal of Systems and Software, vol. 18, No. 1; pp. 1-70.*
Bowen et al.; "Safety-critical systems, formal methods and standard"; Jul. 1993; Software Engineering Journal; pp. 189-209.*
Sumangal Chakrabarty et al., "A Virtual Test-Bench for Analog Circuit Testability Analysis and Fault Diagnosis", IEEE, 1998, pp. 337-352.

* cited by examiner

*Primary Examiner*—Jack Chiang
*Assistant Examiner*—Suresh Memula
(74) *Attorney, Agent, or Firm*—Rothwell, Figg, Ernst & Manbeck, PC

(57) ABSTRACT

The invention provides a system and a method for verifying the robustness of a model of a physical system, the method comprising the following steps: defining a first model of the physical system comprising a set of components and at least one input interface for inserting input values, said first model being defined in a formal language describing the behavior and the function of each of said components; defining in the formal language a determined property that must be satisfied by the model of the physical system; defining in the formal language a second model corresponding to the first model and enriched by a fault injection mechanism; and using formal proof means to search automatically for a combination of injected faults and/or input values that causes said determined property to fail.

15 Claims, 5 Drawing Sheets

CHECKING THE ROBUSTNESS OF A MODEL OF A PHYSICAL SYSTEM

FIELD OF THE INVENTION

The present invention relates to the field of checking the robustness of a model of a physical system in the face of faults appearing.

PRIOR ART

In numerous industries, such as the aviation or space industries, it is common practice to rely on models of systems. For example, a model is designed of a physical system that is to accomplish some given mission, and the model is used in order to evaluate interference between the system and its environment. This is done using either hardware means or software means.

In particular, fault detection logic, reconfiguration logic, and component redundancy are used in order to make a system tolerant to faults.

Unfortunately, it is practically impossible for a model to take account of all eventualities. It often happens that some particular scenario is forgotten, or that a sequential logic error is made, such that some sequence or particular combination of faults can still cause the system to fail.

In order to solve those problems, real systems are bench tested in order to verify their robustness. However, on discovering a defect in a real system, it is necessary to redesign the system, which implies major new engineering costs, hardware and software reverse engineering, and a major loss of time.

OBJECT AND SUMMARY OF THE INVENTION

An object of the present invention is thus to solve the above-mentioned problems by proposing a method of verifying the robustness of a model of an electronic system when faced with faults.

To this end, the invention provides a method of verifying the robustness of a model of a physical system, the method comprising the following steps:
  defining a first model of the physical system comprising a set of components and at least one input interface for inserting input values, said first model being defined in a formal language describing the behavior and the function of each of said components;
  defining in the formal language a determined property that must be satisfied by the model of the physical system;
  defining in the formal language a second model corresponding to the first model and enriched by a fault injection mechanism; and
  using formal proof means to search automatically for a combination of injected faults and/or input values that causes said determined property to fail.

Thus, the second model enables a physical system to be designed that is robust in the face of faults, and for this to be achieved in particular prior to making the system, thus making it possible to reduce the cost of developing it.

This method makes it possible to verify the properties of the system by taking account of various combinations of faults and/or input values to the system.

It also makes it possible to make a system that is of very high quality and good safety by exhaustively verifying any conceivable fault or sequence of faults.

According to a feature of the invention, the fault injection mechanism includes injecting at least one fault into the second model via a fault input interface.

According to another feature of the invention, the fault injection mechanism further comprises the description in the formal language of the effect(s) of said at least one fault on the function or the behavior of each of the components of said electronic system.

The determined property is considered as being true relative to the second model when the formal proof means can find no combination of injected faults and/or input values that causes said determined property to fail. In which case, the model of the physical system is considered as being robust relative to said determined property.

The determined property is considered as being false relative to the second model when the formal proof means finds at least one combination of injected faults and/or input values that causes said determined property to fail. In which case, said combination of injected faults and/or input values causing the determined property to fail corresponds to a scenario that can enable the model of the physical system to be corrected to make it more robust.

Advantageously, the combination of faults is selected from a predefined set of faults.

The determined property expresses a state or a behavior of said physical system. It may be a safety property of said physical system.

BRIEF DESCRIPTION OF THE DRAWINGS

Other features and advantages of the method and the system of the invention appear more clearly on reading the following description given by way of non-limiting indication and made with reference to the accompanying drawings, in which.

DETAILED DESCRIPTION OF EMBODIMENTS

Figure 1:
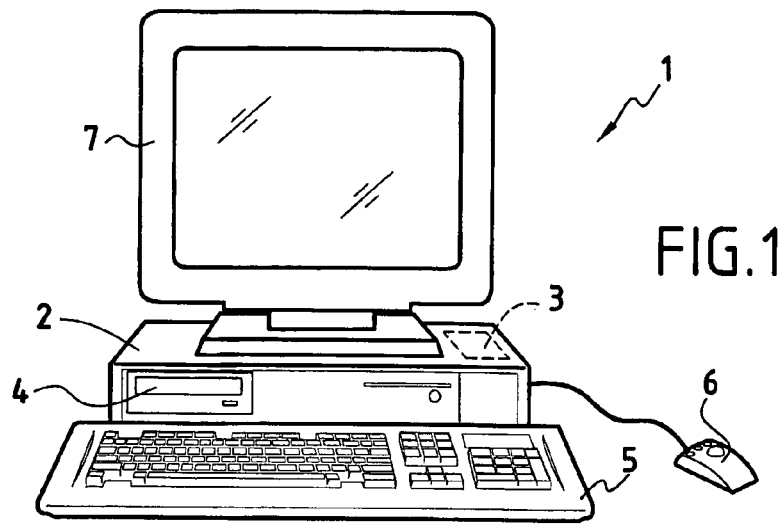
FIG. 1 is a perspective view of hardware means implemented in the method or system of the invention.

FIG. 1 shows a system that can be used for modeling a physical system. The system comprises a workstation or computer 1 used for running a computer program designed to implement the method of the invention.

The computer 1 comprises the hardware means that are conventionally to be found with this type of apparatus. More particularly, the computer comprises a central unit 2 which executes sequences of instructions of the program in accordance with the method of the invention, a central memory 3 which stores data and the program that is being executed, digital data storage media (hard disk, compact disk (CD) 4, floppy disk, . . . ) for long-term storage of the data and programs in use, input peripherals (keyboard 5, mouse 6, . . . ), and output peripherals (screen 7, printer, . . . ) for enabling the model of the physical system to be viewed.

Figure 2:
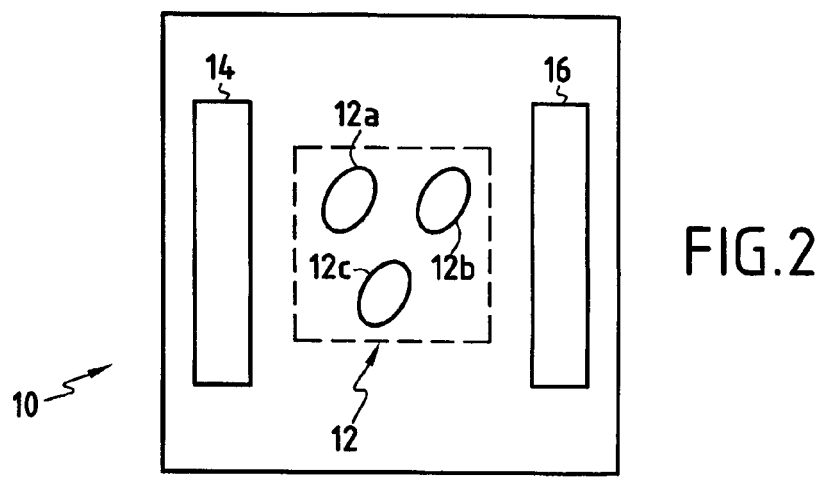
FIG. 2 is a highly schematic diagram of a first model for designing a physical system in accordance with the invention.

In accordance with the invention, FIG. 2 shows a first model 10 for designing a physical system. The physical system may, for example, be an electronics system that, once made, is to support a given application such as monitoring or controlling equipment for regulating an engine.

The first model 10 comprises a set 12 of components 12a, 12b, 12c in communication with one another, at least one input interface 14 for inserting input values, and at least one output interface 16. Naturally, the set 12 of components may be defined on a scale or level of abstraction that depends on the precision or the specificity and the model of the physical system.

This first model 10 is a numerical model representing the architecture of the physical system to be made. It is defined in a formal language of the "Signal" type comprising an alphabet or variables, logical quantifiers, and logical connectors, thus describing the behavior and the function of each of the components 12a, 12b, and 12c. The first model 10 thus enables the physical system to be represented dynamically.

Figure 3:
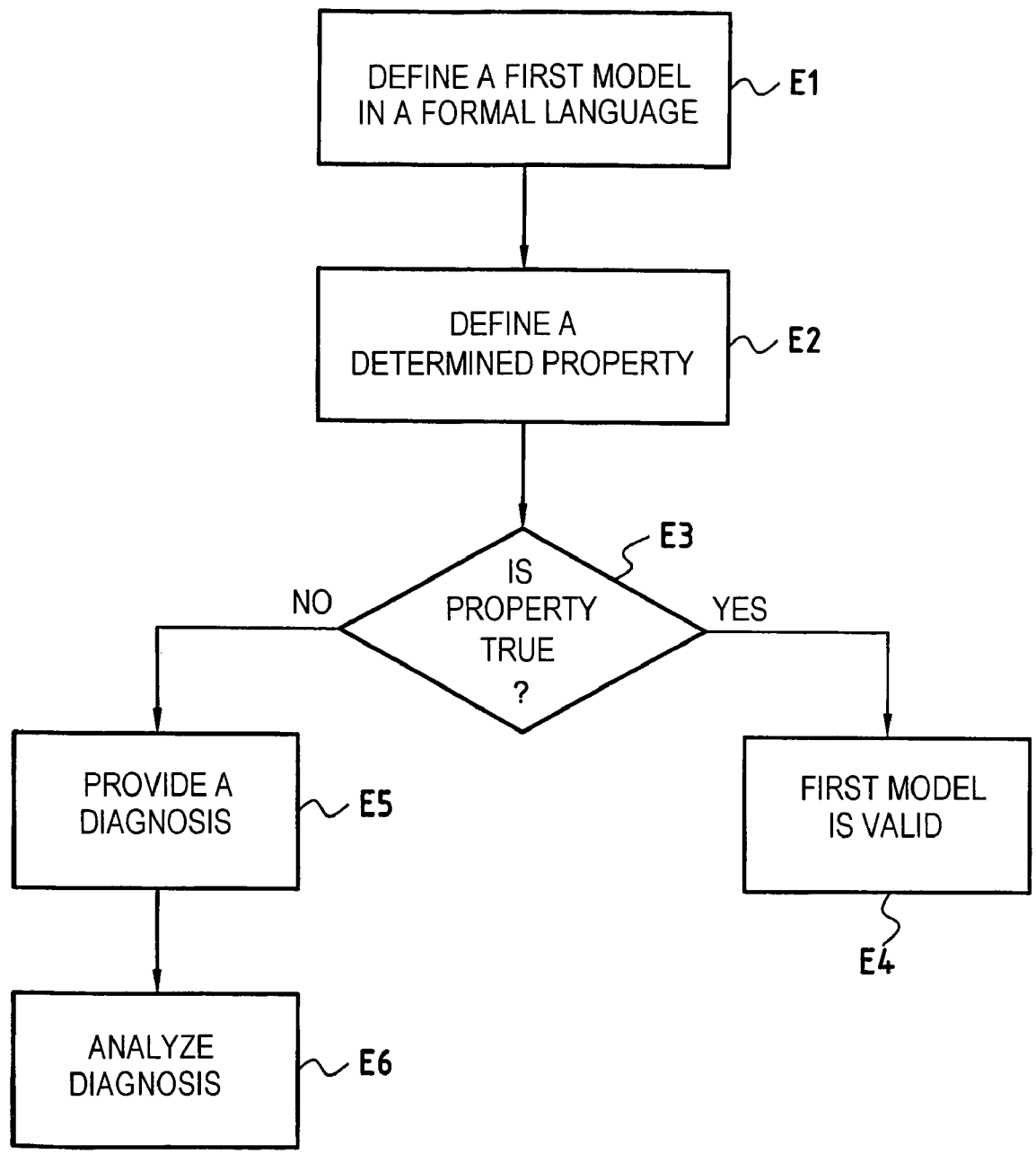
FIG. 3 is a flow chart showing the main steps for determining the validity of the first model shown in FIG. 2.

FIG. 3 is a flow chart showing the main steps for determining the validity of the first model 10.

In step E1, the first model is defined in a formal language.

Then, in step E2, a determined property that must be satisfied by the model of the physical system is also defined in the formal language. The formal description of the property consists in defining the event that corresponds to said property and in encoding this event, e.g. in the Signal language, on the basis of the variables or signals of the model. The determined property is in general a safety property of the type "such an event will never happen", but it may also be a responsiveness property of the type "from such a state, it is possible to reach such an other state at the end of a finite length of time". This property must then satisfy or describe a characteristic of the first model.

The formal language has formal proof means such as the "formal prover" or "checker" in the SILDEX™ software, for semantically verifying the truth of the determined property relative to any value or combination of values input into the first model.

Thus, step E3 is a test of the truth of the determined property relative to any combination of input values. In this step, an automatic search is made by the formal proof means for a combination of input values that causes this determined property to fail.

If the formal proof means can find no combination of input values that causes the determined property to fail, then in step E4, the first model 10 is considered as being valid relative to said property.

In contrast, if the determined property is considered as being false, i.e. if the formal proof means in step E3 finds at least one combination of input values that causes this determined property to fail, then the method moves onto step E5.

In step E5, a diagnosis is provided, comprising the sequences of input values that cause the determined property to fail.

In step E6, depending on the diagnosis provided in the preceding step, the first model 10 is either corrected so that the determined property is satisfied, or else it is affirmed that the combination of input values found by the formal proof means is most improbable.

Figure 4:
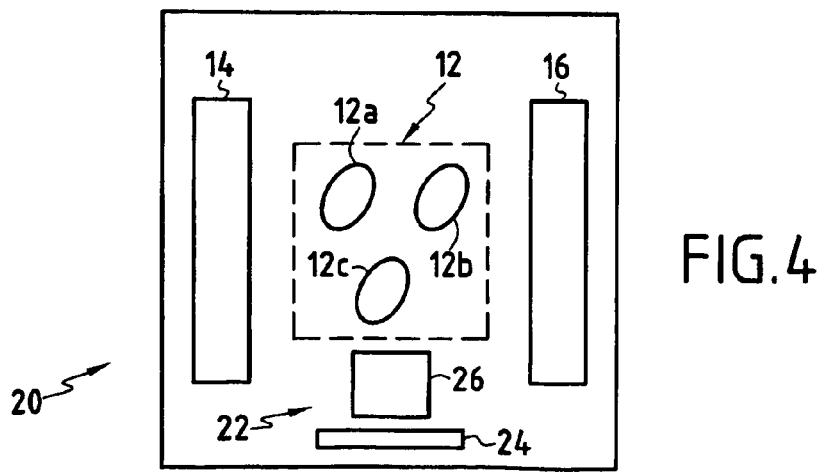
FIG. 4 is a highly schematic diagram showing a second model corresponding to the first model of the physical system enriched by a mechanism for injecting faults in accordance with the invention.

In accordance with the invention, FIG. 4 is a highly diagrammatic view of a second numerical model 20 corresponding to the first model 10 of the physical system and enriched by a fault injection mechanism 22.

The second model 20 differs from the first model 10 in that, in addition to the set 12 of the components 12a, 12b, and 12c, and the input and output interfaces 14 and 16, it further comprises a fault injection mechanism 22 comprising a fault input interface 24 through which at least one fault or combination of faults is injected, together with fault applier means 26.

The fault or combination of faults is selected from a set of predefined faults. The effect of each fault on the behavior of the second model 20 is modeled in a formal language and the consequence of a fault on a given component is described in a behavior diagram for said component. All known possible faults on the least component of the second model 20 are listed and are thus put into the behavior diagram of each component in a database stored in the central memory 3 of the workstation or computer 1, for example.

In other words, the fault injection mechanism 22 includes the description in a formal language of the effect(s) of any fault on the function or the behavior of each of the components 12a, 12b, and 12c of the second model 20 modeling the physical system.

Thus, the second model 20 corresponds to the first model 10 increased by as many additional Boolean inputs and processes as there are associated with foreseeable faults. The input of one particular fault can then take one of two values "false" or "true". For example, the value "false" can correspond to the state "no fault injection", and the value "true" can correspond to the state "fault injection".

When all of the inputs of the fault interface 24 are false, then the second model 20 operates under nominal condition. When a fault input is true, it triggers the logic for applying the fault to the component concerned in application of the behavior diagram for that component.

In addition, when a fault input is free, then the formal proof means can introduce a fault at any time in order to seek a sequence or combination of faults and/or of input values that can cause the determined property to fail.

The formal proof means is a tool that applies logic rules to axioms and/or behavior diagrams for the components 12a, 12b, and 12c of the second model 20 until it obtains a formula describing the determined property.

This formal proof tool can be provided by software of the SILDEX™ type which at all instants during a stimulation can apply a fault to a component or a function of the second model 20 via the fault injection mechanism 22.

Specifically, in order to prove a determined property of the second model 20, a dynamic compilation in formal language of the SILDEX™ type is launched. If the compilation succeeds, then the determined property is validated. Otherwise, the formal proof means gives a scenario including a sequence of faults and/or input values that lead to the system being modeled occupying a state that contradicts said property.

Figure 5:
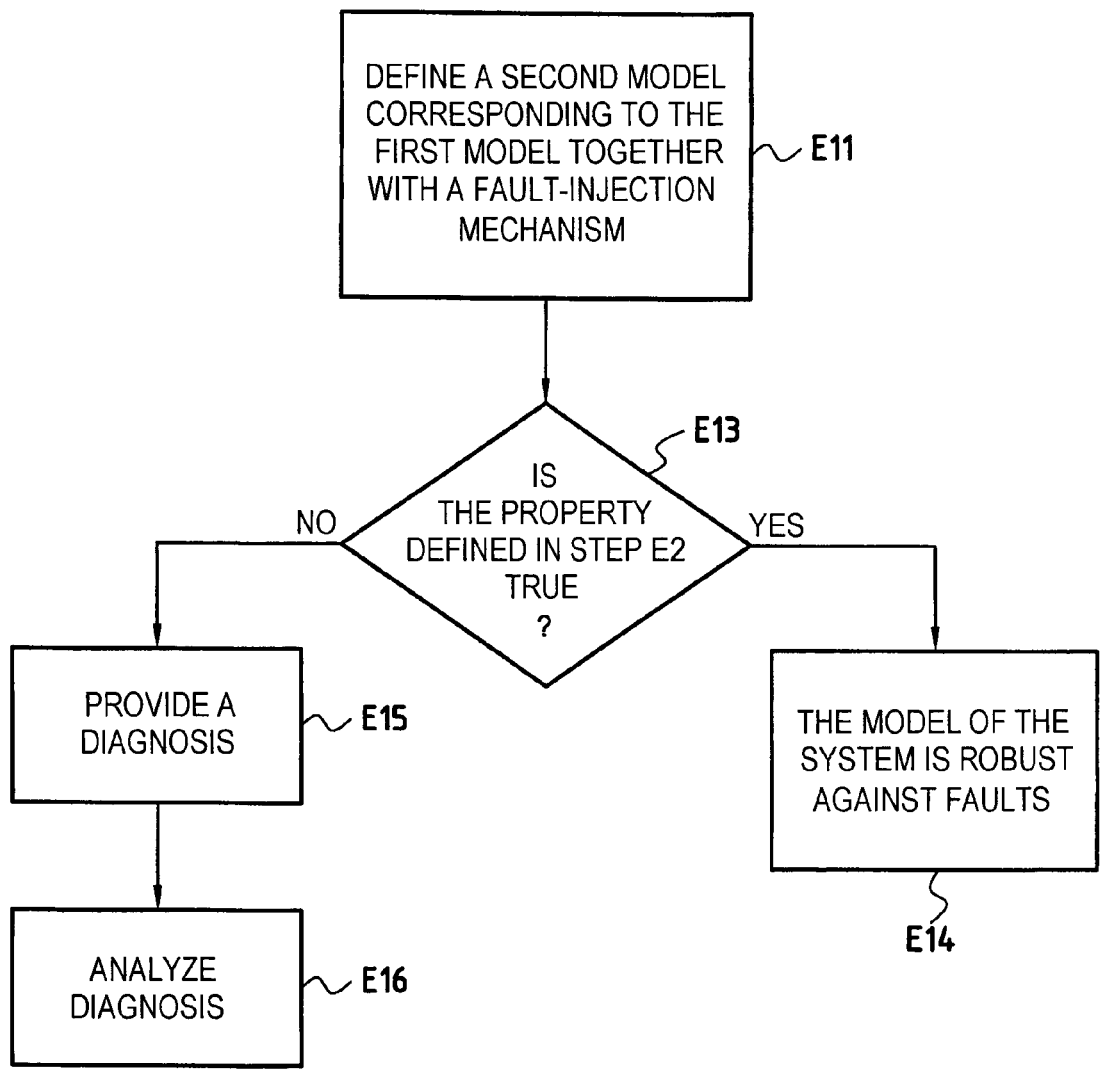
FIG. 5 is a flow chart showing the main steps for verifying the robustness of a model of the physical system faced with the appearance of faults, in accordance with the invention.

FIG. 5 is a flow chart illustrating the main steps for verifying the robustness of a model of the physical system faced with the appearance of faults.

In step E11, the second model 20 is defined in a formal language to correspond to the first model 10 enriched by the fault injection mechanism 22.

Thereafter, it is verified whether the determined property defined in step E2 of the flow chart of FIG. 2 and that has already been verified as being true for the first model 10 (step E4) is still true for the second model 20.

During step E13, the truth of the determined property is tested relative to any combination of injected faults and/or input values. During this step, an automatic search is made by the formal proof means for a combination of injected faults and/or input values that causes said determined property to fail.

If the formal proof means cannot find any combination of injected faults and/or input values that causes said determined property to fail, then the property is considered as being true, and consequently, in step E14, the model of the physical system is considered as being robust in the face of faults relating to the determined property.

In contrast, if during step E13 the formal proof means finds at least one combination of injected faults and/or input values that causes said determined property to fail, then said property is considered as being false, and consequently in step E15, a diagnosis is provided by the formal proof means. This diagnosis comprises the scenario or sequence of inputs via the fault and input value inputs 24 and 14 that leads to the unwanted situation.

In step E16, the diagnosis is analyzed, i.e. the sequence of operations on the second model 20 is examined as are the instants at which the or each fault was injected. This analysis serves to revise the design of the model of the physical system or on the contrary to affirm that the scenario found by the formal proof means is improbable.

Figure 6:
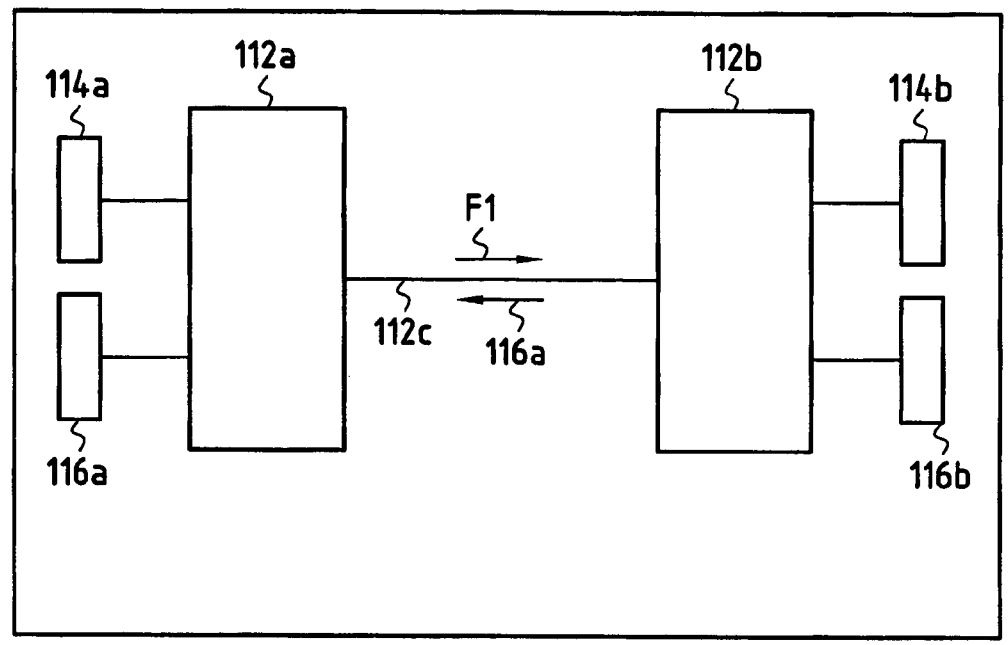
FIG. 6 is a highly schematic diagram of an example of a first model of an electronic system modeling a first computer, a second computer, and a harness, in accordance with the invention.
Figure 7:
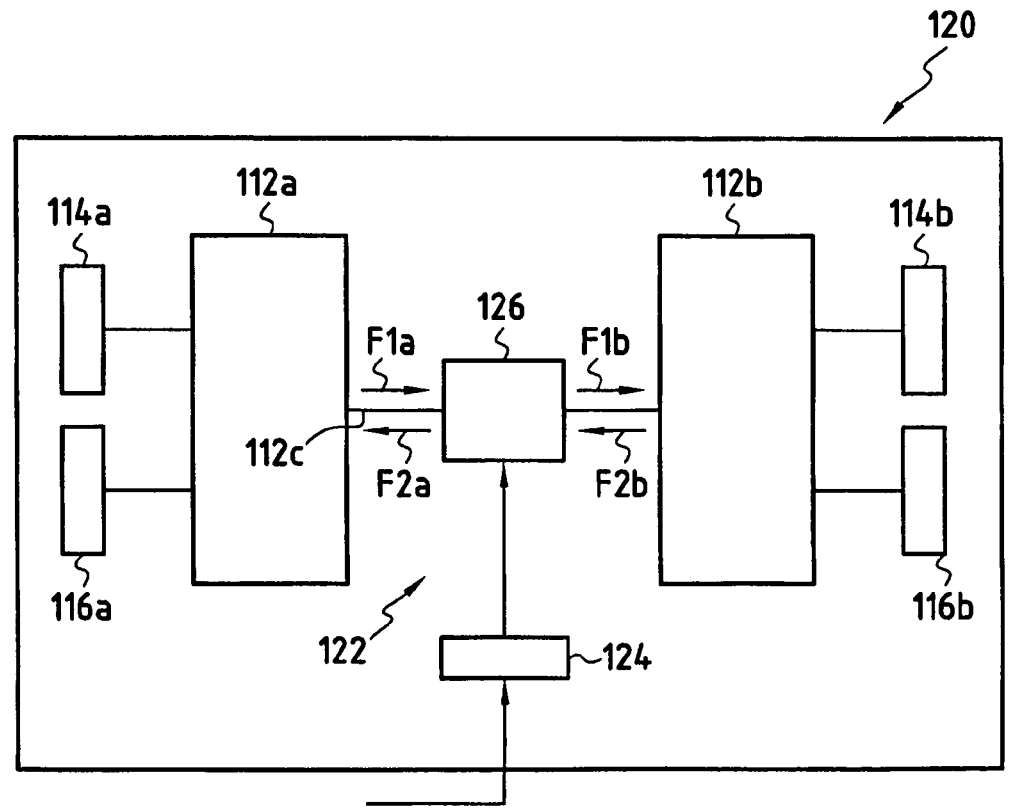
FIG. 7 is a highly schematic diagram showing a second model corresponding to the first model of FIG. 6 enriched by a fault injection mechanism.
Figure 8:
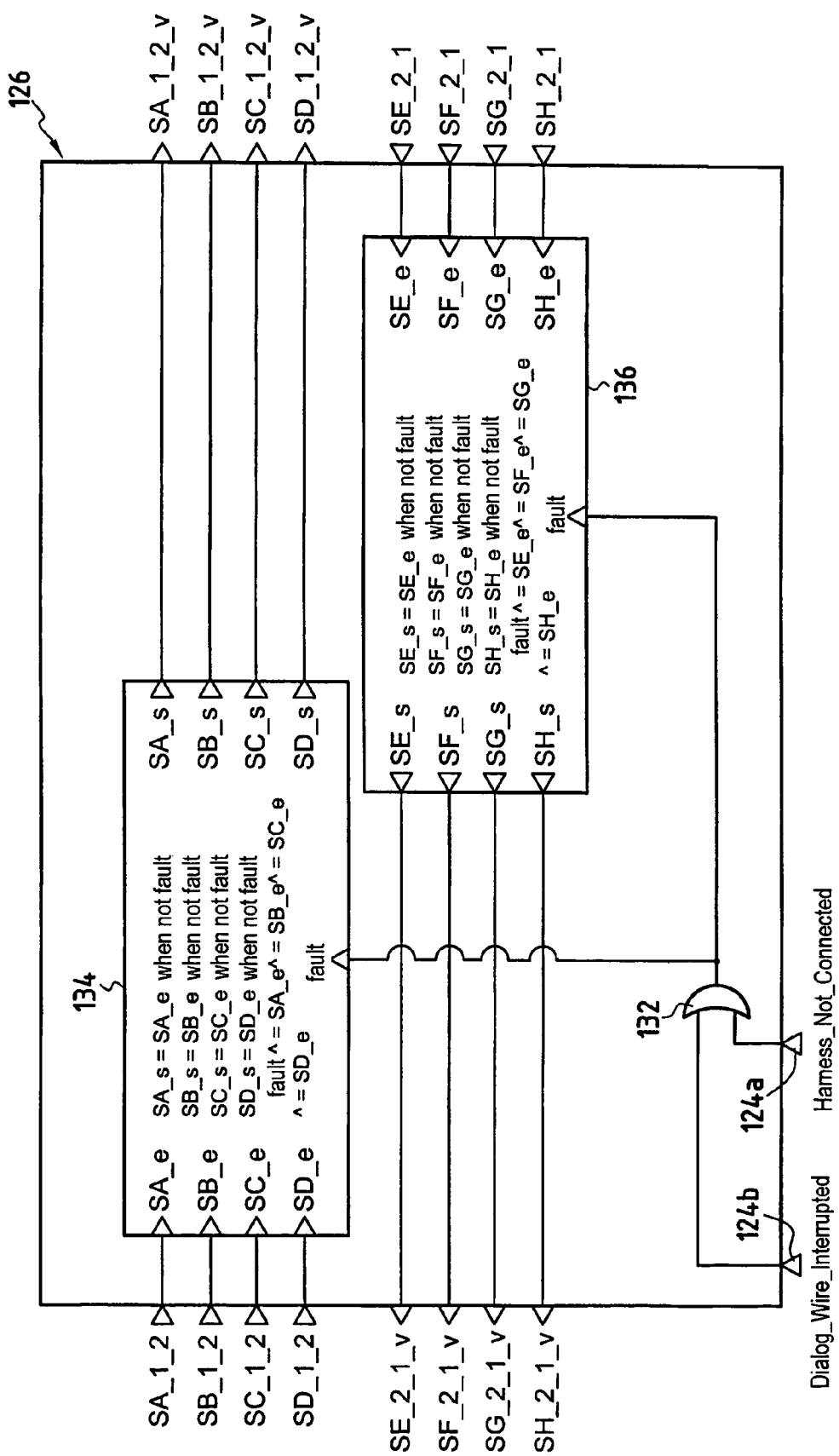
FIG. 8 is a highly schematic diagram of the FIG. 7 mechanism for injecting faults.

FIGS. 6 to 8 show a simplified example of verifying the robustness of a model of a physical system.

In this example, the physical system that is being designed is an electronic system comprising two computers for controlling an airplane engine. In normal operation, only one computer controls the engine and a dialog or an exchange of data takes place between the two computers. Thus, in the event of one of the computers failing, the second computer must start running in single-computer mode. In this example, loss of the system corresponds to both computers being simultaneously either faulty, or passive, or active.

Thus, FIG. 6 shows an example of a first model 110 of the physical system modeling a first computer 112a having a first input interface 114a and a first output interface 116a, a second computer 112b having a second input interface 114b and a second output interface 116b, and an inter-computer harness 112c having connection wires enabling the dialog or the exchange of data to take place between the first and second computers 112a and 112b. Arrow F1 designates signals or data (written S_1_2 in the Signal language) transmitted by the first computer 112a to the second computer 112b, and arrow F2 represents the signals or data (written S_2_1 in the Signal language) going from the second computer 112b to the first computer 112a.

FIG. 7 shows a second model 120 of the physical system corresponding to the first model 110 of FIG. 6, and enriched by a fault injection mechanism 122 comprising a fault input interface 124 and a fault applier means 126. In this example, the fault applier means 126 comprises switch means simulating a fault in a single connection wire that goes open circuit, or wires that are short circuited, or the harness 112c being unconnected. Arrow F1a represents signals S_1_2 leaving the first computer 112a and arrow F1b represents signals S_1_2_v entering the second computer 112b after passing through the fault applier means 126. Arrow F2b designates the signals S_2_1 leaving the second computer 112b, and arrow F2a represents the signals S_2_1_v entering the first computer 112a after passing through the fault applier means 126. When there is no fault, the signal leaving the first or second computer 112a or 112b enters unchanged into the second or first computer 112b or 112a respectively. In contrast, in the event of a fault, the signal leaving one or the other of the computers 112a, 112b does not reach its destination. In the Signal language this is represented by the following equations:

S_1_2_v=S_1_2 when not fault

S_2_1_v=S_2_1 when not fault

FIG. 8 is a highly schematic diagram showing the fault injection mechanism and in particular the fault applier means 126 of FIG. 7. The fault applier means 126 comprises a first fault input 124a corresponding to "harness not connected" and a second fault input 124b corresponding to "dialog wire interrupted". The first and second fault inputs 124a and 124b are connected to the inputs of a logic OR gate 132 whose output is applied to a first connection/disconnection means 134 for transferring or not transferring data from the first computer 112a to the second computer 112b, and to a second connection/disconnection means 136 for transferring or not transferring data from the second computer 112b to the first computer 112a.

The fault inputs can be thought of as buttons for applying faults to the modeled components. Thus, during simulations, it is possible to introduce faults at desired instants.

When the formal proof means undertakes the automatic search for a combination of injected faults and/or input values that causes the determined property to fail, the inputs set to the "false" value are not involved in the search for a counter-example scenario. Only the free inputs are involved in this search.

Thus, when no fault is injected into the first connection means 134, the input signals SA_e, SB_e, SC_e, and SD_e are equal respectively to the output signals SA_s, SB_s, SC_s, and SD_s of the connection means 134. Under such circumstances, the signals SA_1_2, SB_1_2, SC_1_2, and SD_1_2 transmitted from the first computer 112a are enabled by the first connection means 134 and are forwarded to the second computer, being written respectively as follows: SA_1_2_v, SB_1_2_v, SC_1_2_v, and SD_1_2_v.

Similarly, when no fault is injected into the second connection means 136, the input signals SE_e, SF_e, SG_e, and SH_e equal respectively to the output signals SE_s, SF_s, SG_s, and SH_s from the connection means. Under such circumstances, the signals SE_2_1, SF_2_1, SG_2_1, and SH_2_1 transmitted from the first computer 112b are enabled by the second connection means 136 to be sent to the first computer 112a respectively as follows:

SE_2_1_v, SF_2_1_v, SG_2_1_v, and SH_2_1_v.

When the first fault input 124a corresponding to "harness not connected" and/or the second fault input 124b corresponding to "dialog wire interrupted" is free, the formal proof means or prover can introduce a harness disconnection and/or a wire disconnection at any time. Under such circumstances, the signal(s) transmitted by one of the computers 112a, 112b cannot reach the other computer.

After initialization, the above example can be written in the Signal language as follows:

```
process xxx_process_sildex_1=
    (? boolean SA_e, fault, SB_e, SC_e, SD_e;
     | boolean SA_s, SB_s, SC_s, SD_s;)
    (|       (| SA_s = SA_e when not fault
             | SB_s = SB_e when not fault
```

-continued

```
          | SC_s = SC_e when not fault
          | SD_s = SD_e when not fault
          | fault^ = SA_e^ = SB_e^ =
            SC_e^ = SD_e
          |)
     |);
process xxx_process_sildex_2=
     (? boolean SE_e, fault, SF_e, SG_e, SH_e;
        | boolean SE_s, SF_s, SG_s, SH_s;)
     (|        (| SE_s = SE_e when not fault
          | SF_s = SF_e when not fault
          | SG_s = SG_e when not fault
          | SH_s = SH_e when not fault
          | fault^ = SE_e^ = SF_e^ =
            SG_e^ = SH_e
          |)
     |);
```

In general, in the model of a physical system having two computers, it is possible to examine the following two properties: "the model of the system cannot find itself with two computers active" and "the model of the system cannot find itself with two computers passive".

In addition, it is possible to envisage modeling the situation in the presence of a single fault when the system is switched on. Under such circumstances, it is possible to verify whether any single fault present at switch-on might not cause the system to take on the above-specified properties.

Furthermore, it is possible to envisage modeling the presence of a single fault in operation, with both computers starting up simultaneously. Under such circumstances, it is assumed that each single fault can be introduced at any instant. To do this, the fault input in question can be left free while keeping all the others false.

Faults can be selected from a set of predefined faults comprising the following faults: no fault; autotest fail; open circuit; short circuit; break in sending; harness not connected; synchronization fault; NVM fault forced to false; NVM fault forced to true; PPAVM signal fault forced to false; PPAVM signal fault forced to true; PPAVMTPB; computer fault; PH signal fault forced to false; PH signal fault forced to true; etc.

Thus, the invention makes it possible to verify the robustness of the model in the face of faults, prior to making the physical system, thereby enabling a system to be made that presents good safety while reducing the cost of developing the system.

Naturally, the invention also makes it possible to verify the robustness of a physical system that has already been made. Under such circumstances, the physical system is modeled using a model in formal language and the robustness of the model of the physical system is checked in the manner described above with respect to criteria defined by determined properties for the system when faced with failures.

What is claimed is:

1. A method of verifying the robustness of a model of a physical system, the method comprising the following steps:
    defining a first model of the physical system comprising a set of components and at least one input interface for inserting input values, said first model being defined in a formal language describing the behavior and the function of each of said components;
    defining in the formal language a determined property that must be satisfied by the model of the physical system;
    using a computer system executing formal proof software stored on computer-readable media to search automatically for a combination of input values that causes said determined property to fail relative to said first model;
    providing a diagnosis comprising sequences of input values in case said determined property fails relative to the first model;
    correcting the first model so that said determined property is verified to be true relative to the first model;
    defining in the formal language a second model of the physical system corresponding to the first model and enriched by a fault injection mechanism if no combination of input values that causes said determined property to fail is found and said determined property has already been verified to be satisfied relative to the first model; and
    using a computer system executing formal proof software stored on computer-readable media to search automatically for a combination of injected faults and/or input values that causes said determined property to fail relative to the second model.

2. A method according to claim 1, wherein the fault injection mechanism comprises injecting at least one fault into the second model via a fault input interface.

3. A method according to claim 2, wherein the fault injection mechanism further comprises a description in the formal language of at least one effect of said at least one fault on the function or the behavior of each of the components of said physical system.

4. A method according to claim 1, wherein the determined property is considered as being true relative to the second model when the formal proof software can find no combination of injected faults and/or input values that causes said determined property to fail.

5. A method according to claim 4, wherein the model of the physical system is considered as being robust relative to said determined property.

6. A method according to claim 1, wherein the determined property is considered as being false relative to the second model when the formal proof software finds at least one combination of injected faults and/or input values that causes said determined property to fail.

7. A method according to claim 6, wherein said combination of injected faults and/or input values causing the determined property to fail corresponds to a scenario that can enable the model of the physical system to be corrected to make it more robust.

8. A method according to claim 1, wherein the combination of faults is selected from a predefined set of faults.

9. A method according to claim 1, wherein the determined property expresses a state or a behavior of said physical system.

10. A method according to claim 9, wherein the determined property is a safety property of said physical system.

11. The method of claim 1, wherein the first model of the physical system is an electronic system comprising at least one computer for controlling an engine.

12. A system for verifying the robustness of a model of a physical system, the system comprising:
    a first model defining the physical system and comprising a set of components and at least one input interface for inserting input values, said first model being defined in a formal language describing the behavior and the function of each of said components:
    a predetermined property defined in the formal language that must be satisfied by the model of the physical system;
    a computer executing formal proof software for searching automatically for a combination of input values that causes said determined property to fail relative to the first model;

means for providing a diagnosis comprising sequences of input values in case said determined property fails relative to the first model;

means for correcting the first model so that said determined property is verified to be true relative to the first model;

a second model of the physical system defined in the formal language, the second model corresponding to the first model enriched by a mechanism for injecting faults, said second model being defined if the computer executing formal proof software finds no combination of input values that causes said determined property to fail and said determined property has already been verified to be satisfied relative to the first model; and a computer executing formal proof software for searching automatically for a combination of injected faults and/or input values that causes said determined property to fail relative to the second model.

13. A system according to claim 12, wherein the mechanism for injecting faults comprises a fault input interface and fault applier means.

14. A system according to claim 12, wherein the physical system is an electronic system comprising two computers for controlling an airplane engine.

15. The system of claim 12, wherein the first model of the physical system is an electronic system comprising at least one computer for controlling an engine.

* * * * *